United States Patent
Tabata et al.

(10) Patent No.: US 10,541,147 B2
(45) Date of Patent: Jan. 21, 2020

(54) ETCHING METHOD

(71) Applicant: TOKYO ELECTRON LIMITED, Tokyo (JP)

(72) Inventors: Masahiro Tabata, Miyagi (JP); Takayuki Katsunuma, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/202,356

(22) Filed: Jul. 5, 2016

(65) Prior Publication Data
US 2017/0011939 A1 Jan. 12, 2017

(30) Foreign Application Priority Data
Jul. 7, 2015 (JP) .................................. 2015-135905

(51) Int. Cl.
*H01L 21/02* (2006.01)
*H01L 21/306* (2006.01)
(Continued)

(52) U.S. Cl.
CPC .. *H01L 21/31144* (2013.01); *H01L 21/31116* (2013.01); *H01L 21/76813* (2013.01); *H01L 21/76897* (2013.01)

(58) Field of Classification Search
CPC ......... H01L 21/67069; H01L 21/76897; H01L 21/76813; H01L 21/6833; H01L 21/3065;
(Continued)

(56) References Cited

U.S. PATENT DOCUMENTS

2002/0001963 A1* 1/2002 Tadokoro .......... H01L 21/31116
438/710
2006/0222771 A1* 10/2006 Seamons ................ C23C 16/26
427/248.1
(Continued)

FOREIGN PATENT DOCUMENTS

JP 10-079375 A 3/1998
JP 2002-25979 A 1/2002
(Continued)

OTHER PUBLICATIONS

Kim et al., "Study on self-bias voltage induced on the substrate by r.f. bias power in a high density plasma", Thin Solid Films 435 (2003) 288-292).*

*Primary Examiner* — Thomas T Pham
(74) *Attorney, Agent, or Firm* — Rothwell, Figg, Ernst & Manbeck, P.C.

(57) ABSTRACT

A method for selectively etching a first region of silicon oxide with respect to a second region of silicon nitride, includes: preparing a target object including the first region and the second region in a processing chamber of a plasma processing apparatus; and generating a plasma of a processing gas containing a fluorocarbon gas and a rare gas in the processing chamber. In the generating the plasma of the processing gas, a self-bias potential of a lower electrode on which the target object is mounted is greater than or equal to 4V and smaller than or equal to 350V and a flow rate of the rare gas in the processing gas is 250 to 5000 times of a flow rate of the fluorocarbon gas in the processing gas.

11 Claims, 16 Drawing Sheets

(51) Int. Cl.
*H01L 21/3213* (2006.01)
*H01L 21/311* (2006.01)
*H01L 21/768* (2006.01)

(58) Field of Classification Search
CPC ......... H01L 21/31116; H01L 21/31056; H01L 21/0234; H01L 21/30655; H01L 21/32136; H01L 21/32137
See application file for complete search history.

(56) References Cited

U.S. PATENT DOCUMENTS

| | | | |
|---|---|---|---|
| 2007/0205414 A1 | 9/2007 | Chang et al. | |
| 2007/0227665 A1* | 10/2007 | Matsumoto | H01J 37/32091 156/345.47 |
| 2013/0119018 A1* | 5/2013 | Kanarik | H05H 1/46 216/67 |
| 2014/0116620 A1* | 5/2014 | Kuwabara | C23C 16/509 156/345.24 |
| 2016/0005602 A1* | 1/2016 | Yoo | H01L 21/0338 216/41 |

FOREIGN PATENT DOCUMENTS

| | | |
|---|---|---|
| JP | 2002-075973 A | 3/2002 |
| JP | 2009-105279 A | 5/2009 |

* cited by examiner

ETCHING METHOD

CROSS-REFERENCE TO RELATED APPLICATIONS

This application claims priority to Japanese Patent Application No. 2015-135905 filed on Jul. 7, 2015, the entire contents of which is incorporated herein by reference.

FIELD OF THE INVENTION

The disclosure relates to an etching method; and more particularly, to a method for selectively etching a first region of silicon oxide with respect to a second region of silicon nitride.

BACKGROUND OF THE INVENTION

In manufacturing electronic devices, the first region of silicon oxide is selectively etched with respect to the second region of silicon nitride. In this etching process, a plasma of a processing gas containing a fluorocarbon gas, argon gas and oxygen gas is generated in a processing chamber of a plasma processing apparatus, as disclosed in, e.g., Japanese Patent Application Publication No. 2002-25979.

A SAC (Self-Aligned Contact) technique is known as a technique for selectively etching the first region with respect to the second region. In the SAC technique, the first region in a recess formed by the second region is etched in a self-aligned manner. In the SAC technique, the aforementioned processing gas is used and a plasma of the processing gas is generated in the processing chamber.

In the above-described technique, the second region is considerably etched when the first region is etched. Therefore, it is required to etch the first region of silicon oxide while suppressing etching of the second region of silicon nitride.

SUMMARY OF THE INVENTION

In accordance with an aspect, there is provided a method for selectively etching a first region of silicon oxide with respect to a second region of silicon nitride. The method includes: preparing a target object including the first region and the second region in a processing chamber of a plasma processing apparatus; and generating a plasma of a processing gas containing a fluorocarbon gas and a rare gas in the processing chamber. In the generating the plasma of the processing gas, a self-bias potential of a lower electrode on which the target object is mounted is greater than or equal to 4V and smaller than or equal to 350V and a flow rate of the rare gas in the processing gas is 250 to 5000 times of a flow rate of the fluorocarbon gas in the processing gas.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
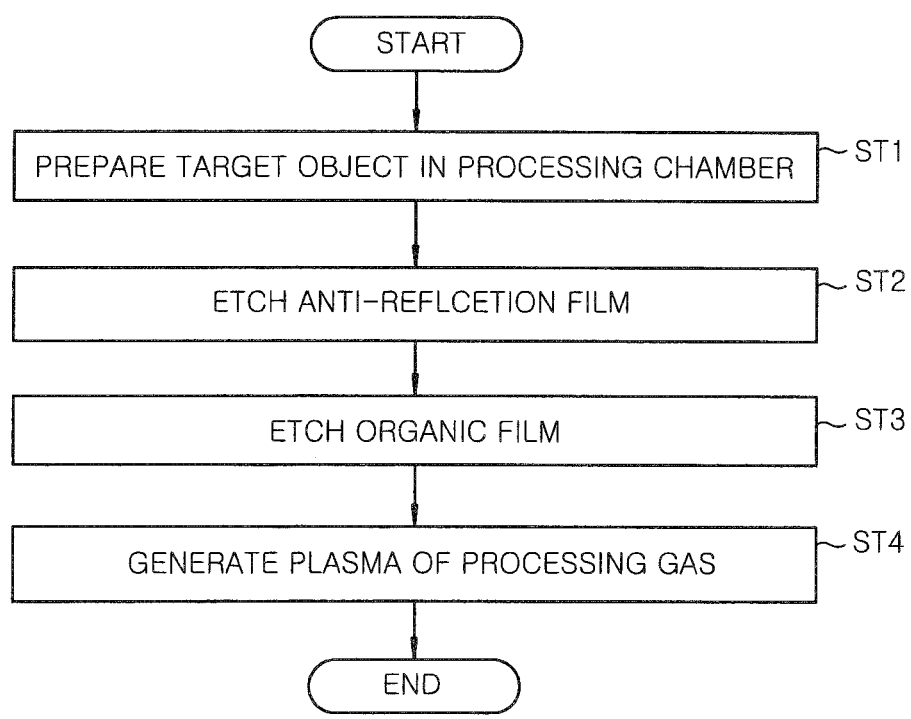
FIG. 1 is a flowchart showing an etching method according to an embodiment.

Hereinafter, embodiments will be described in detail with reference to the accompanying drawings. Further, like reference numerals will be used for like parts throughout the respective drawings.

FIG. 1 is a flowchart showing an etching method according to an embodiment. A method MT shown in FIG. 1 is a method for selectively etching a first region of silicon oxide with respect to a second region of silicon nitride.

Figure 2:
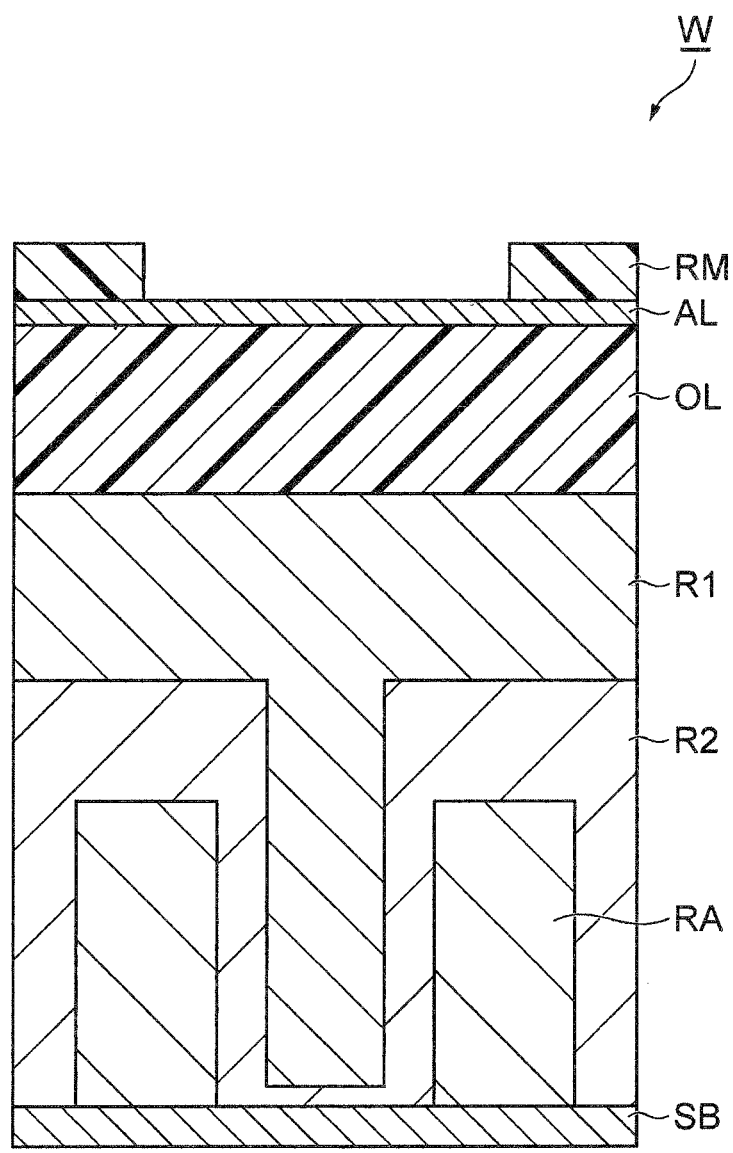
FIG. 2 is a partially enlarged cross sectional view of an example of a target object to be processed.

FIG. 2 is a partially enlarged cross sectional view of an example of a target object to be processed. As shown in FIG. 2, the target object (hereinafter, referred to as "wafer W") includes a substrate SB, a first region R1, a second region R2, and an organic film OL that will become a mask later. For example, the wafer W is obtained during the manufacturing process of a fin-type field effect transistor and further includes a protruding region RA, a silicon-containing anti-reflection film AL, and a resist mask RM.

The protruding region RA protrudes from the substrate SB. The protruding region RA may serve as, e.g., a gate region. The second region R2 is made of silicon nitride ($Si_3N_4$) and formed on surfaces of the protruding region RA and the substrate SB. As shown in FIG. 2, the second region R2 extends to form a recess. For example, the recess has a depth of about 150 nm and a width of about 20 nm.

The first region R1 is made of silicon oxide ($SiO_2$) and formed on the second region R2. Specifically, the first region R1 fills the recess formed by the second region R2 and covers the second region R2.

The organic film OL is formed on the first region R1. The organic film OL may be made of an organic material, e.g., amorphous carbon. The anti-reflection film AL is formed on the organic film OL. The resist mask RM is formed on the anti-reflection film AL. The resist mask RM provides an opening having a width greater than that of the recess formed by the second region R2. The opening of the resist mask RM has a width of, e.g., about 60 nm. A pattern of the resist mask RM is formed by a photolithography technique.

Figure 3:
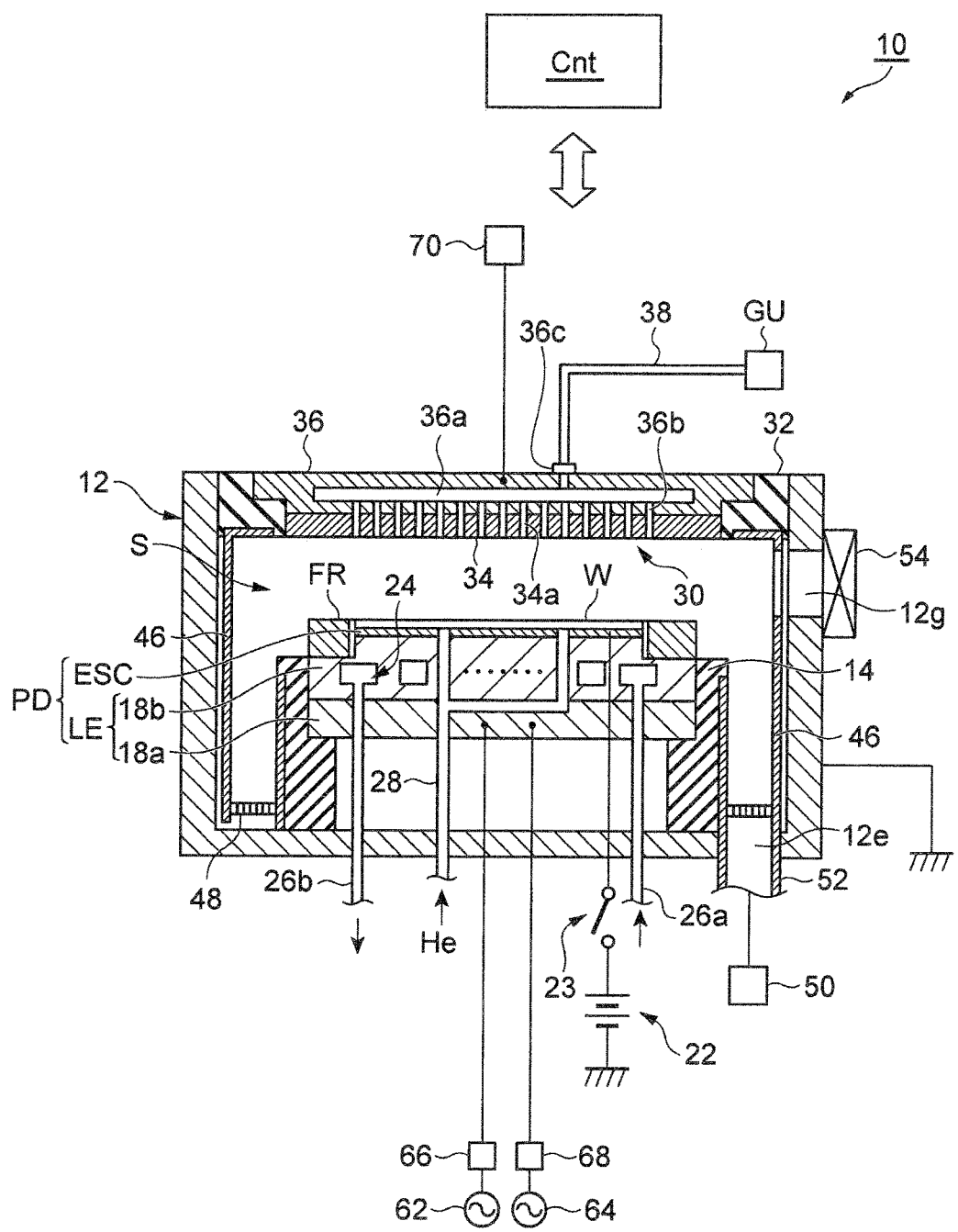
FIG. 3 schematically shows an example of a plasma processing apparatus.

In the method MT, the target object such as the wafer W shown in FIG. 2 is processed in a plasma processing apparatus. FIG. 3 schematically shows an example of the plasma processing apparatus. The plasma processing apparatus 10 shown in FIG. 3 is configured as a capacitively coupled plasma etching apparatus and includes a substantially cylindrical processing chamber 12. The processing chamber 12 is made of, e.g., aluminum, and an inner wall surface of the processing chamber 12 is anodically oxidized. The processing chamber 12 is frame-grounded.

A substantially cylindrical supporting part 14 is provided at a bottom portion of the processing chamber 12. The supporting part 14 is made of, e.g., an insulating material. In the processing chamber 12, the supporting part extends vertically from the bottom portion of the processing chamber 12. Further, in the processing chamber 12, a mounting table PD is provided. The mounting table PD is supported by the supporting part 14.

The wafer W is held on a top surface of the mounting table PD. The mounting table PD includes a lower electrode LE and an electrostatic chuck ESC. The lower electrode LE has a first plate 18a and a second plate 18b. The first plate 18a and the second plate 18b are made of a metal, e.g., aluminum, and have a substantially disc shape. The second plate 18b is provided on the first plate 18a and electrically connected to the first plate 18a.

The electrostatic chuck ESC is provided on the second plate 18b. The electrostatic chuck ESC has a structure in which an electrode made of a conductive film is interposed between two insulating layers or two insulating sheets. A DC power supply 22 is electrically connected to the electrode of the electrostatic chuck ESC through a switch 23. The wafer W is attracted and held on the electrostatic chuck ESC by an electrostatic force such as a Coulomb force or the like generated by a DC voltage applied from the DC power supply 22.

A focus ring FR is provided on a peripheral portion of the second plate 18b to surround an edge of the wafer W and the electrostatic chuck ESC. The focus ring FR is provided to improve uniformity of etching. The focus ring FR is made of a material that is appropriately selected depending on a material of an etching target film. For example, the focus ring FR may be made of quartz.

A coolant path 24 is provided in the second plate 18b. The coolant path 24 constitutes a temperature control mechanism. A coolant is supplied to the coolant path 24 from an external chiller unit through a line 26a. The coolant flowing in the coolant path 24 returns to the chiller unit through a line 26b. The coolant circulates between the coolant path 24 and the chiller. A temperature of the wafer W held on the electrostatic chuck ESC is controlled by controlling a temperature of the coolant.

The plasma processing apparatus 10 further includes a gas supply line 28. A heat transfer gas supply unit (not shown) supplies a heat transfer gas, e.g., He gas to a gap between a top surface of the electrostatic chuck ESC and a backside of the wafer W through the gas supply line 28.

The plasma processing apparatus 10 further includes an upper electrode 30. The upper electrode 30 is provided above the mounting table PD to face the mounting table PD. The upper electrode 30 and the lower electrode LE are approximately parallel to each other. Between the upper electrode 30 and the mounting table PD, a processing space S where plasma processing is performed on the wafer W is defined.

The upper electrode 30 is held at an upper portion of the processing chamber 12 through an insulating shield member 32. In the present embodiment, the upper electrode 30 may be configured such that a vertical distance from the top surface of the mounting table PD, i.e., a wafer mounting surface, to the upper electrode 30 is variable. The upper electrode 30 may include a top plate 34 and a holding body 36. The top plate 34 is in contact with the space S and has a plurality of gas injection openings 34a. In the present embodiment, the top plate 34 is made of silicon.

The holding body 36 detachably holds the top plate 34 and is made of a conductive material, e.g., aluminum. The holding body 36 may have a water cooling structure. A gas diffusion space 36a is provided in the holding body 36. A plurality of gas passage holes 36b communicating with the gas injection openings 34a extends downward from the gas diffusion space 36a. Further, the holding body 36 includes a gas inlet port 36c for guiding a processing gas into the gas diffusion space 36a. A gas supply line 38 is connected to the gas inlet port 36c.

Figure 4:
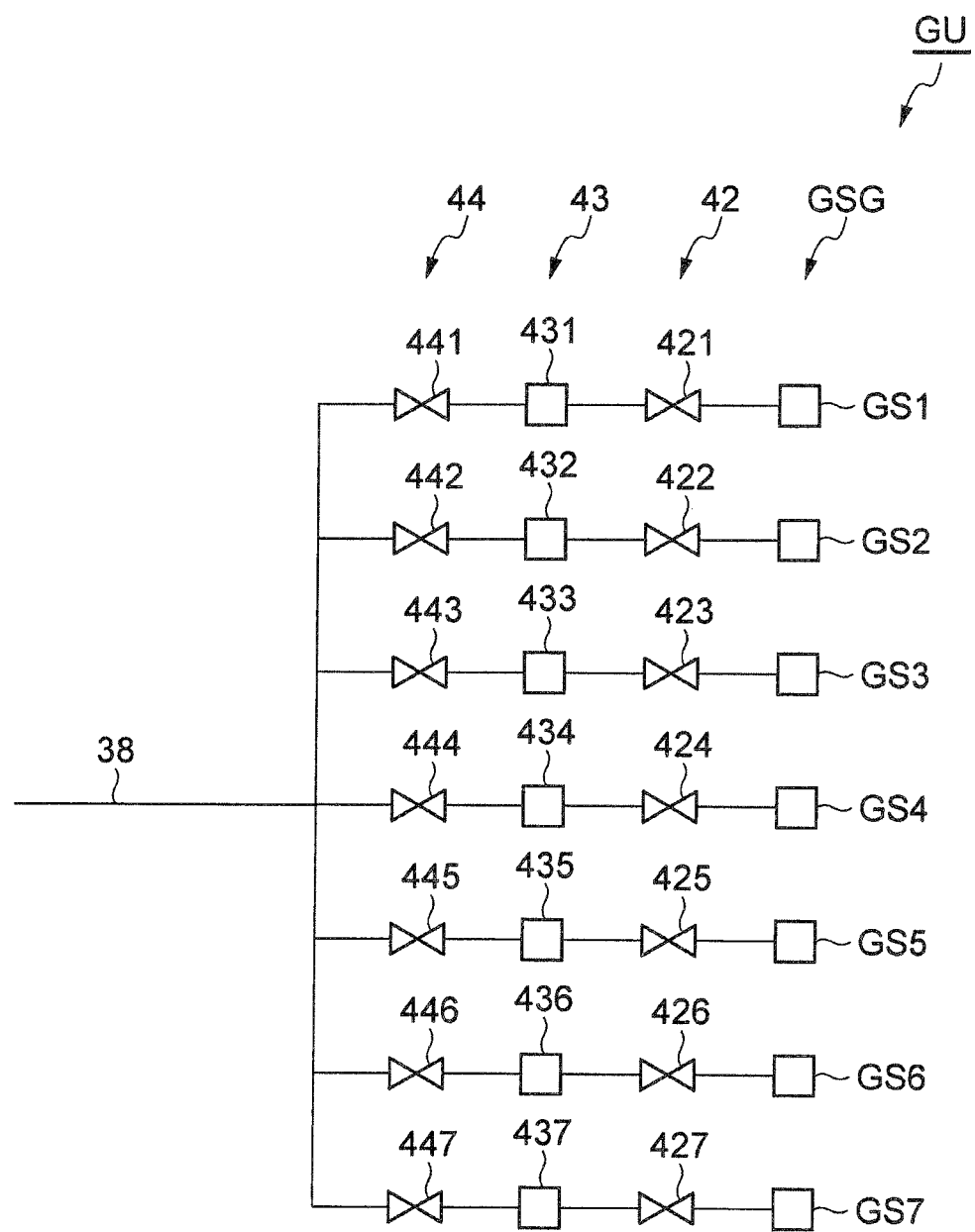
FIG. 4 shows an example of a gas supply unit.

The gas supply line 38 is connected to a gas supply unit GU. FIG. 4 shows an example of the gas supply unit. The first exemplary gas supply unit GU shown in FIG. 4 includes a gas source group GSG, a valve group 42, a flow rate controller group 43, and a valve group 44. In the first exemplary gas supply unit GU, the gas source group GSG includes a plurality of gas sources GS1 to GS7; the valve group 42 includes a plurality of valves 421 to 427; the flow rate controller group 43 includes a plurality of flow rate controllers 431 to 437; and the valve group 44 includes a plurality of valves 441 to 447. Further, each of the flow rate controllers 431 to 437 is a mass flow controller or a pressure-controlled flow rate controller.

The gas source GS1 is a source of $C_4F_8$ gas and is connected to the gas supply line 38 via the valve 421, the flow rate controller 431, and the valve 441. The gas source GS2 is a source of $CF_4$ gas and is connected to the gas supply line 38 via the valve 422, the flow rate controller 432, and the valve 442. The gas source GS3 is a source of $C_4F_6$ gas and is connected to the gas supply line 38 via the valve 423, the flow rate controller 433, and the valve 443. The gas source GS4 is a source of a rare gas and is connected to the gas supply line 38 via the valve 424, the flow rate controller 434, and the valve 444. The rare gas may be any rare gas such as He gas, Ne gas, Ar gas or Kr gas. The gas source GS5 is a source of nitrogen gas ($N_2$ gas) and is connected to the gas supply line 38 via the valve 425, the flow rate controller 435, and the valve 445. The gas source GS6 is a source of hydrogen gas ($H_2$ gas) and is connected to the gas supply line 38 via the valve 426, the flow rate controller 436, and the valve 446. The gas source GS7 is a source of oxygen gas ($O_2$ gas) and is connected to the gas supply source 38 via the valve 427, the flow rate controller 437, and the valve 447. The first exemplary gas supply unit GU may further include a source of an oxygen-containing gas, e.g., a source of a carbon oxide gas, and valves and a flow rate controller which are provided between the corresponding source and the gas supply line 38.

The first exemplary gas supply unit GU includes a plurality of gas sources for a plurality of different single gases and is configured to control a flow rate of a gas from selected one or more gas sources and supply the gas at the controlled flow rate to the gas supply line 38.

Figure 5:
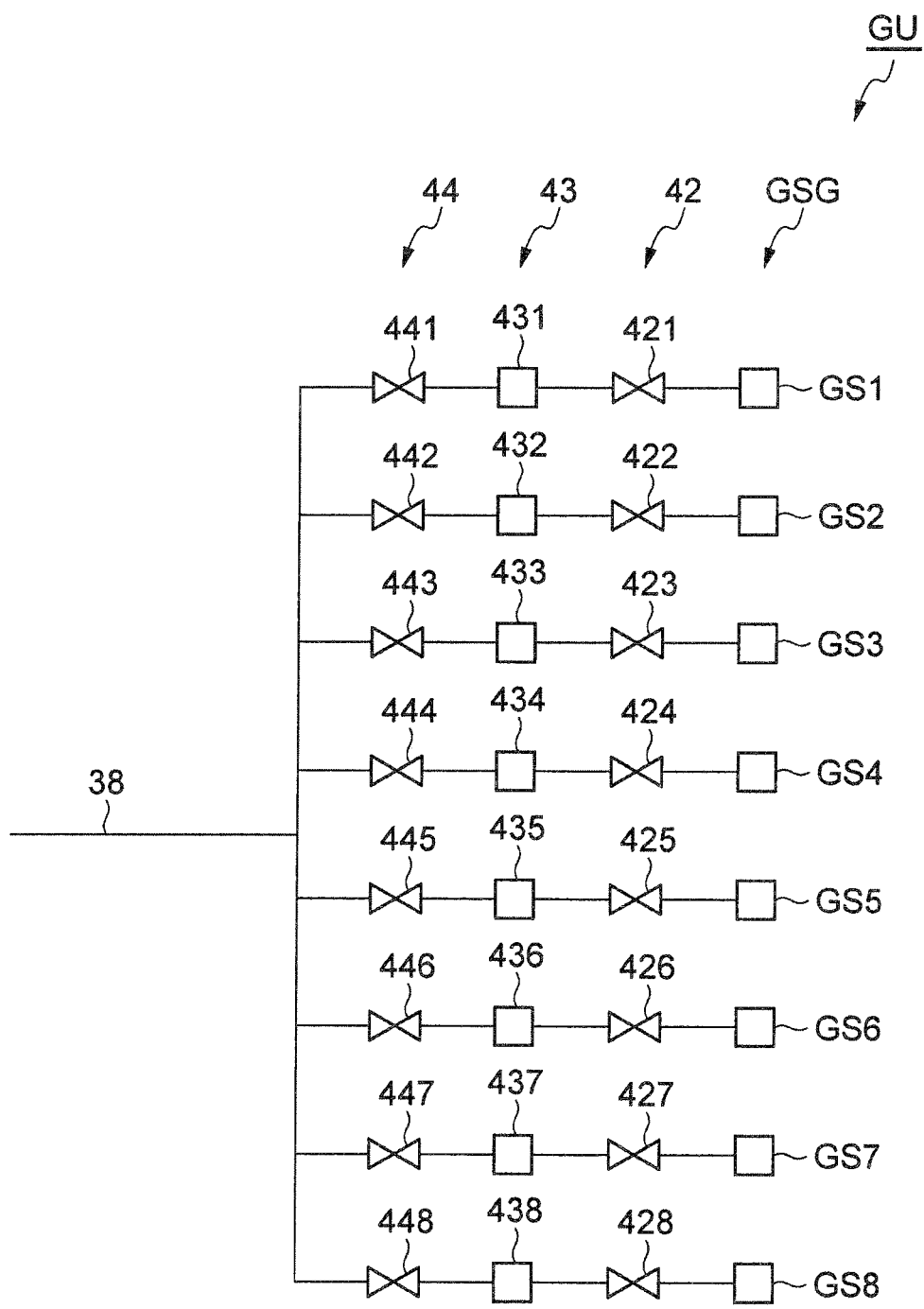
FIG. 5 shows another example of the gas supply unit.

FIG. 5 shows another example of the gas supply unit. In the second exemplary gas supply unit GU shown in FIG. 5, the gas source group GSG includes a gas source GS8 in addition to the aforementioned gas sources GS1 to GS7. In the second exemplary gas supply unit GU, the valve group 42 further includes a valve 428; the flow rate controller group 43 further includes a flow rate controller 438; and the valve group 44 further includes a valve 448. The second exemplary gas supply unit GU may further include a source of an oxygen-containing gas, e.g., a source of a carbon oxide gas, and valves and a flow rate controller which are provided between the source and the gas supply line 38.

The gas source GS8 is a source of a gaseous mixture of a fluorocarbon gas and a rare gas, i.e., a source of a first gas. The fluorocarbon gas is, e.g., $C_4F_6$ gas. The rare gas is any rare gas as described above. The gas source GS8 is connected to the gas supply line 38 via the valve 428, the flow rate controller 438, and the valve 448. The gas from the gas source GS8 may be used in a step ST4 to be described later. The processing gas used in the step ST4 is obtained by diluting a fluorocarbon gas with a rare gas having a large flow rate. Therefore, the flow rate of the fluorocarbon gas in the total flow rate of the processing gas is considerably small. When the fluorocarbon gas having such a flow rate is supplied from a gas source of a single gas, the flow rate controller requires a high accuracy. Meanwhile, in the second exemplary gas supply unit GU, there is used a single gas source GS8 for a mixed gas of a fluorocarbon gas of a desired flow rate and a rare gas of a desired flow rate. Accordingly, in the second exemplary gas supply unit GU, it is possible to supply the fluorocarbon gas at a desired flow rate and the rare gas at a desired flow rate without using a flow rate controller having a high accuracy.

Figure 6:
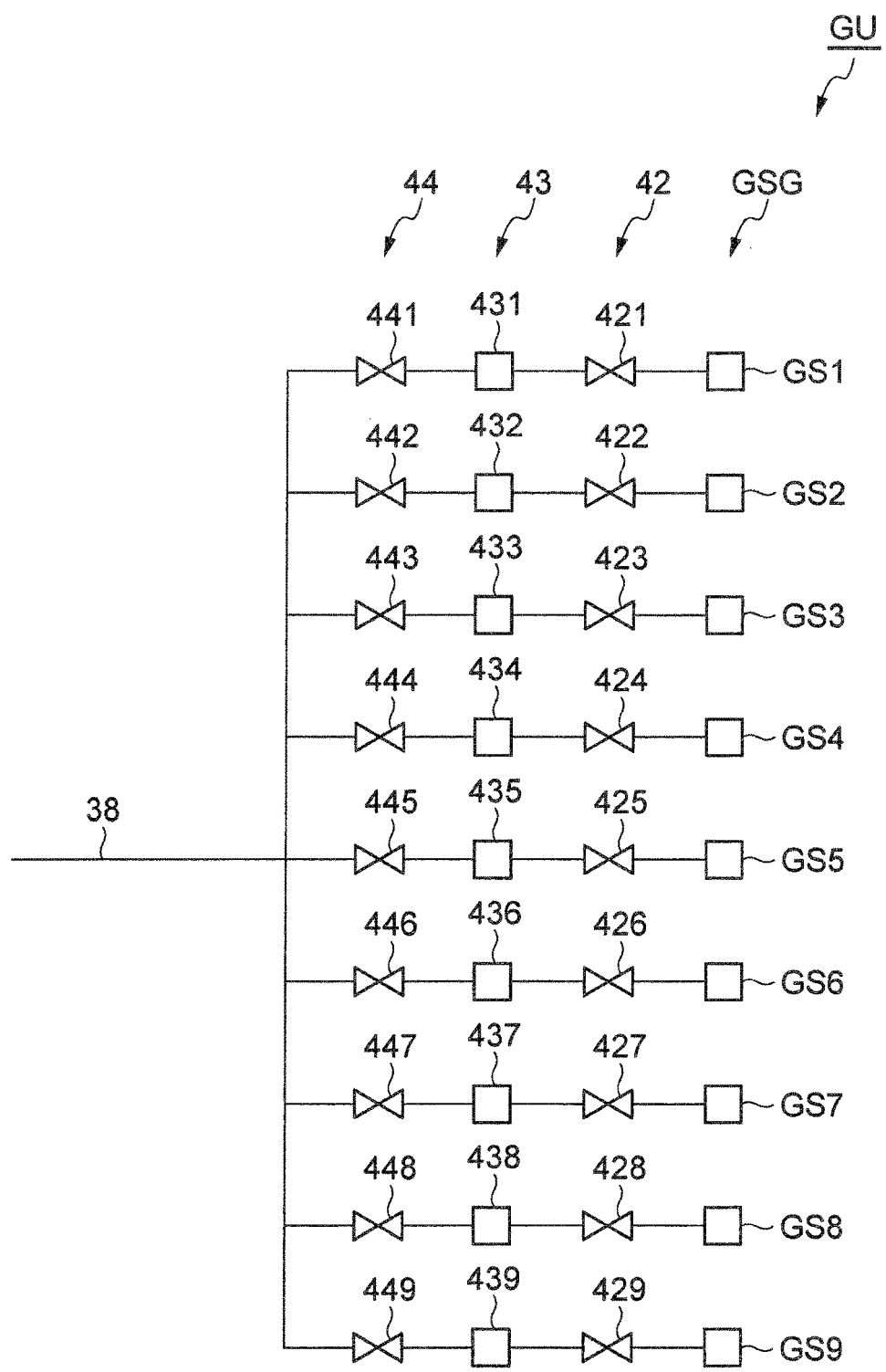
FIG. 6 shows a still another example of the gas supply unit.

FIG. 6 shows a still another example of the gas supply unit. In a third exemplary gas supply unit GU shown in FIG. 6, a gas source group GSG includes a gas source GS9 in addition to the aforementioned gas sources GS1 to GS8. In the second gas supply unit GU, the valve group 42 further includes a valve 429; the flow rate controller group 43 further includes a flow rate controller 439; and the valve group 44 further includes a valve 449. The third gas supply unit GU may further include a source of an oxygen-containing gas, e.g., a source of a carbon oxide gas, and valves and a flow rate controller which are provided between the corresponding source and the gas supply line 38.

The gas source GS9 is a source of a second gas. The second gas includes only a rare gas or includes a fluorocarbon gas and a rare gas. When the second gas includes a fluorocarbon gas and a rare gas, the volume ratio of the fluorocarbon gas and the rare gas in the gas source GS9 is different from that of the first gas in the gas source GS8. The gas source GS8 and the gas source GS9 of the third exemplary gas supply unit GU are used to supply the processing gas in the step ST4. In this step, the flow rate of the first gas of the gas source GS8 and the flow rate of the second gas of the gas source GS9 are controlled depending on a desired flow rate of the fluorocarbon gas and a desired flow rate of the rare gas. Accordingly, the flow rate of the fluorocarbon gas in the processing gas can be controlled with a high resolution without using a flow rate controller having a high accuracy.

For example, it is assumed that the first gas of the gas source GS8 includes a fluorocarbon gas and a rare gas at a volume ratio of 0.1%:99.9% and the second gas of the gas source GS9 includes only a rare gas. In this case, if the flow rate of the first gas is controlled to 500 sccm and the flow rate of the second gas is controlled to 500 sccm, the flow rate of the rare gas becomes about 1000 sccm and the flow rate of the fluorocarbon gas becomes 0.5 sccm. Further, if the flow rate of the first gas is controlled to 490 sccm and the flow rate of the second gas is controlled to 510 sccm, the flow rate of the rare gas becomes about 1000 sccm and the flow rate of the fluorocarbon gas becomes 0.49 sccm. Even if the resolution in controlling the flow rate of the first gas of the gas source GS8 and the flow rate of the second gas of the gas source GS9 is low, it is possible to control the flow rate of the fluorocarbon gas with a high resolution.

Referring back to FIG. 3, in the plasma processing apparatus 10, a deposition shield 46 is detachably provided along the inner wall of the processing chamber 12. The deposition shield 46 is also provided at an outer periphery of the supporting part 14. The deposition shield 46 prevents an etching by-product (deposit) from being adhered to the processing chamber 12. The deposition shield 46 may be made of aluminum coated with ceramic such as $Y_2O_3$ or the like.

A gas exhaust plate 48 is provided at a lower portion in the processing chamber 12 and between the supporting part 14 and the sidewall of the processing chamber 12. A plurality of through-holes is formed through the gas exhaust plate 48 in a thickness direction thereof. The gas exhaust plate 48 may be formed by coating aluminum with ceramic, e.g., $Y_2O_3$ or the like. In the processing chamber 12, a gas exhaust port 12e is provided below the gas exhaust plate 48. A gas exhaust unit 50 is connected to the gas exhaust port 12e through a gas exhaust line 52. The gas exhaust unit 50 has a vacuum pump such as a turbo molecular pump or the like, and can depressurize the space in the processing chamber 12 to a predetermined vacuum level. A loading/unloading port 12g for the wafer W is provided at the sidewall of the processing chamber 12. The loading/unloading port 12g can be opened and closed by a gate valve 54.

The plasma processing apparatus 10 further includes a first high frequency power supply 62 and a second high frequency power supply 64. The first high frequency power supply 62 generates a high frequency power for plasma generation, e.g., a high frequency power having a frequency in a range from 27 MHz to 100 MHz. The first high frequency power supply 62 is connected to the lower electrode LE through a matching unit 66. The matching unit 66 has a circuit for matching an output impedance of the first high frequency power supply 62 with an input impedance of the load side (the lower electrode LE side). The first high frequency power supply 62 may be connected to the upper electrode 30 through the matching unit 66.

The second high frequency power supply 64 generates a high frequency bias power for ion attraction to the wafer W, e.g., a high frequency bias power having a frequency in a range from 400 kHz to 13.56 MHz. The second high frequency power supply 64 is connected to the lower electrode LE through a matching unit 68. The matching unit 68 has a circuit for matching an output impedance of the second high frequency power supply 64 with an input impedance of the load side (the lower electrode LE side).

The plasma processing apparatus 10 further includes a power supply 70. The power supply 70 is connected to the upper electrode 30. The power supply 70 applies to the upper electrode 30 a voltage for attracting positive ions in the processing space S to the top plate 34. In this example, the power supply 70 is a DC power supply for generating a negative DC voltage. In another example, the power supply 70 may be an AC power supply for generating an AC voltage having a relatively low frequency. The voltage applied from the power supply 70 to the upper electrode 30 may be lower than or equal to −150V. In other words, the voltage applied from the power supply 70 to the upper electrode 30 may be a negative voltage having an absolute value of 150 or above. When such a voltage is applied from the power supply 70 to the upper electrode 30, the positive ions in the processing space S collide with the top plate 34. Accordingly, secondary electrons and/or silicon are emitted from the top plate 34. The emitted silicon is combined with active species of fluorine in the processing space S, so that the amount of active species of fluorine is decreased.

In the present embodiment, the plasma processing apparatus 10 may further include a control unit Cnt. The control unit Cnt is a computer including a processor, a storage unit, an input device, a display device and the like. The control unit Cnt controls the respective components of the plasma processing apparatus 10. The control unit Cnt can allow an operator to input commands to manage the plasma processing apparatus 10 by using the input device and display the operation state of the plasma processing apparatus 10 on the display device. The storage unit of the control unit Cnt stores therein a control program for controlling various processes performed in the plasma processing apparatus 10, and a program, i.e., a processing recipe, for performing processes of the respective components of the plasma processing apparatus 10 based on the processing conditions.

Figure 7:
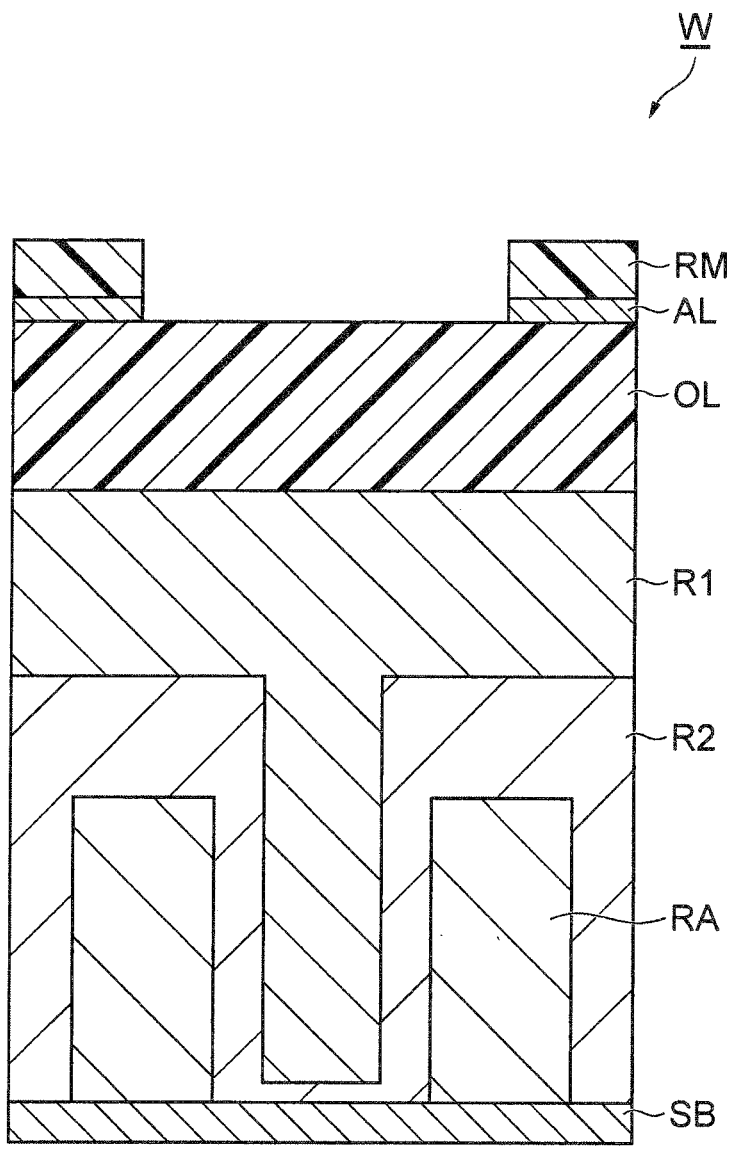
FIGS. 7 to 9 are partially enlarged cross sectional views of the target object during implementation of the method shown in FIG. 1.
Figure 8:
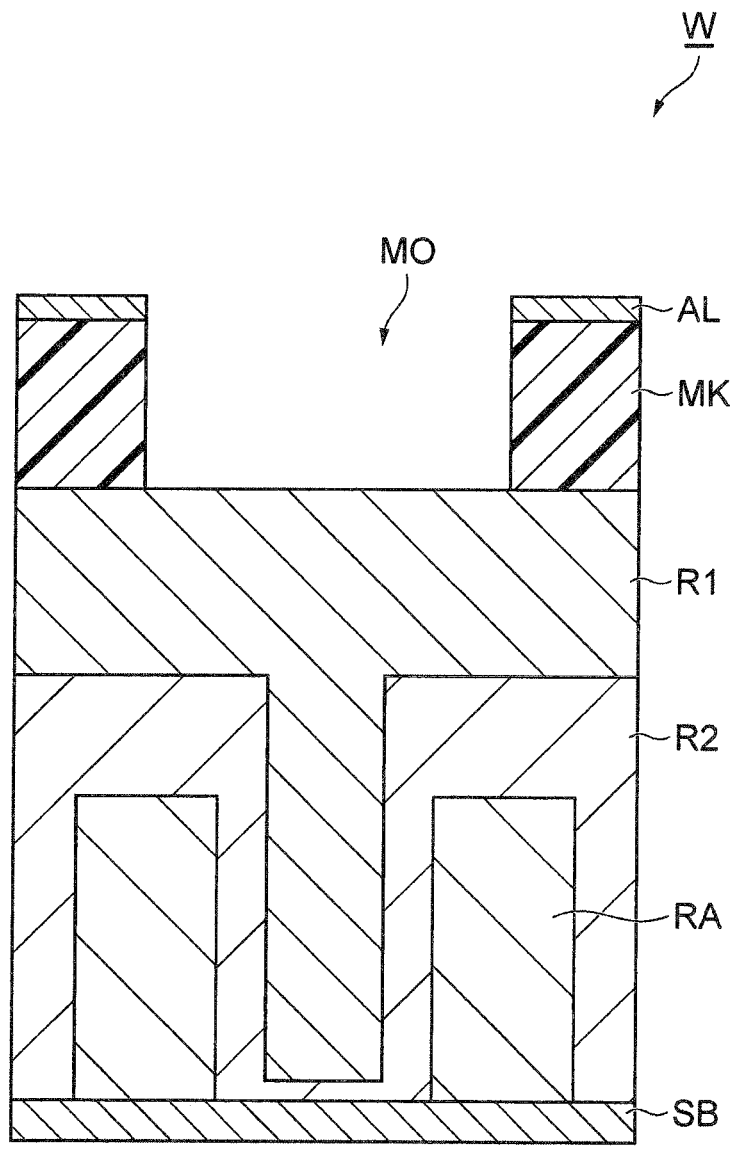
Figure 9:
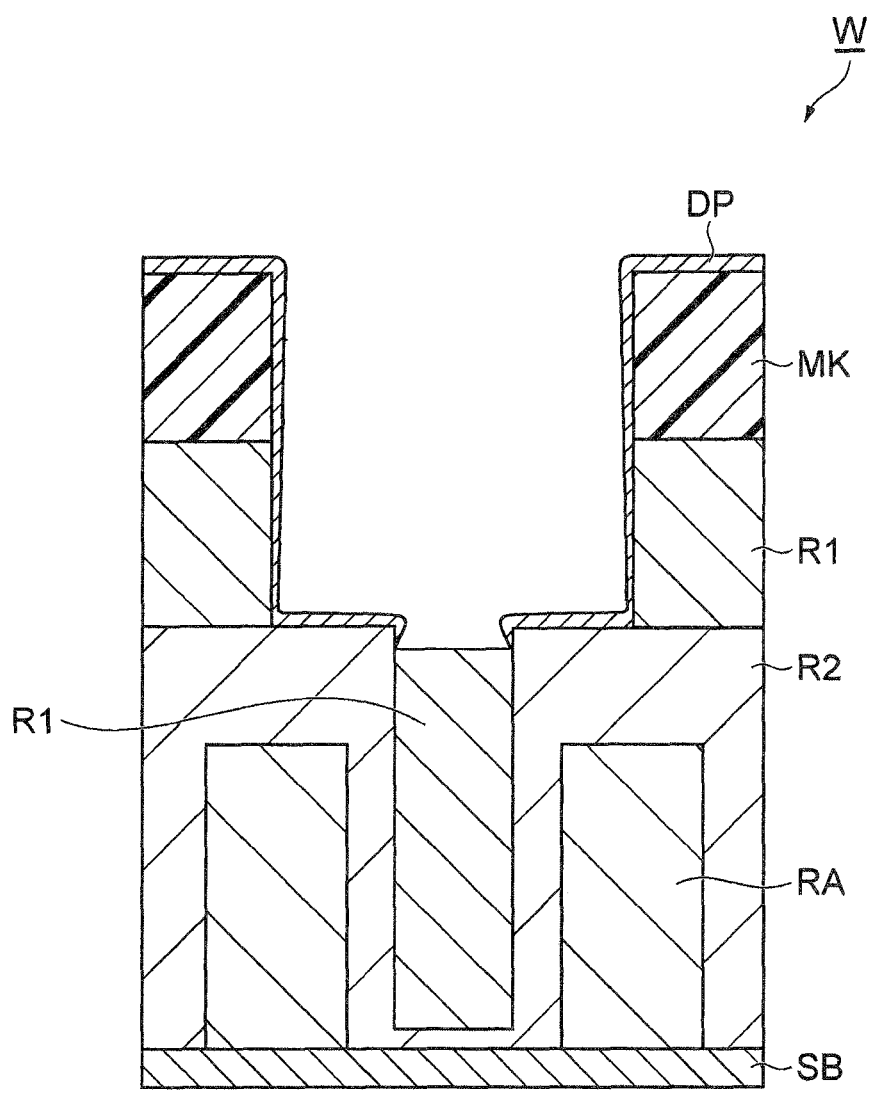
Figure 10:
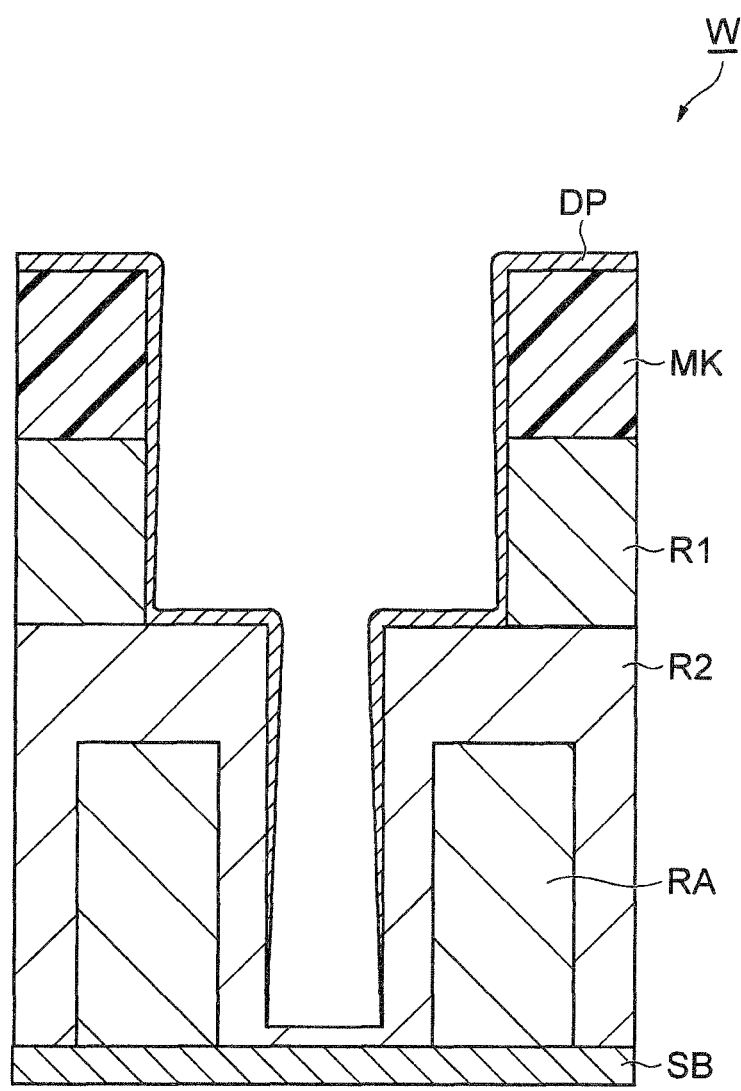
FIG. 10 is a partially enlarged cross sectional view of the target object after the implementation of the method shown in FIG. 1.

Hereinafter, the method MT will be described in detail with reference to FIG. 1. Hereinafter, FIGS. 2 and 7 to 10 will be appropriately referred to together with FIG. 1. FIGS. 7 to 9 are partially enlarged cross sectional views of the target object during the implementation of the method shown in FIG. 1. FIG. 10 is a partially enlarged cross sectional view of the target object after the implementation of the method shown in FIG. 1. In the following, an example in which the wafer W shown in FIG. 2 is processed by the method MT by using a single plasma processing apparatus 10 shown in FIG. 3 will be described. In the respective steps of the method MT implemented by using the plasma processing apparatus 10, the operations of the respective units of the plasma processing apparatus 10 can be controlled by the control unit Cnt.

First, a step ST1 of the method MT is executed. In the step ST1, the wafer W shown in FIG. 2 is prepared in the processing chamber 12 of the plasma processing apparatus 10. Specifically, the wafer W is loaded into the processing chamber 12 to be mounted on the mounting table PD and held thereon by the electrostatic chuck ES of the mounting table PD.

Next, a step ST2 of the method MT is executed. In the ST2, the anti-reflection film AL is etched. To that end, a processing gas is supplied into the processing chamber 12 from a gas source selected among the gas sources of the gas source group GSG. This processing gas includes a fluorocarbon gas. The fluorocarbon gas may contain, e.g., at least one of $C_4F_8$ gas and $CF_4$ gas. The processing gas may further include a rare gas, e.g., Ar gas. In the step ST2, a pressure in the processing chamber 12 is set to a predetermined level by the operation of the gas exhaust unit 50. In the step ST2, the high frequency power from the first high frequency power supply 62 and the high frequency bias power from the second high frequency power supply 64 are supplied to the lower electrode LE.

In the step ST2, the plasma of the processing gas is generated and a portion of the anti-reflection film AL which is exposed through the opening of the resist mask RM is etched by active species of fluorine and/or fluorocarbon. As a result, the portion of the anti-reflection film AL which is exposed through the opening of the resist mask RM is removed as can be seen from FIG. 7. In other words, a pattern of the resist mask RM is transferred to the anti-reflection film AL and the anti-reflection film AL is formed to have a pattern providing an opening.

Next, in a step ST3, the organic film OL is etched. To that end, a processing gas is supplied into the processing chamber 12 from a gas source selected among the gas sources of the gas source group GSG. This processing gas may include hydrogen gas and nitrogen gas. Moreover, the processing gas used in the step ST3 may contain another gas, e.g., oxygen gas, as long as it can etch the organic film. In the step ST3, a pressure in the processing chamber 12 is set to a predetermined level by the operation of the gas exhaust unit 50. In the step ST3, the high frequency power from the first high frequency power supply 62 and the high frequency bias power from the second high frequency power supply 64 are supplied to the lower electrode LE.

In the step ST3, the plasma of the processing gas is generated and a portion of the organic film OL which is exposed through the opening of the anti-reflection film AL is etched. The resist mask RM is also etched. As a result, the resist mask RM is removed and the portion of the organic film OL which is exposed through the opening of the anti-reflection film AL is removed, as can be seen from FIG. 8. In other words, the pattern of the anti-reflection film AL is transferred to the organic film OL and the organic film OL is formed to have a pattern providing an opening MO, thereby serving as a mask MK.

Then, in the step ST4, the first region R1 is etched. To that end, in the step ST4, a plasma of a processing gas is generated in the processing chamber 12. This processing gas includes a fluorocarbon gas and a rare gas. The fluorocarbon gas is, e.g., $C_4F_6$ gas. The rare gas is, e.g., Ar gas. In the present embodiment, the processing gas further includes oxygen gas. Since the oxygen gas is included in the processing gas, the amount of deposit DP to be described later is appropriately controlled.

In the step ST4, the processing gas is supplied into the processing chamber 12 from a gas source selected among the gas sources of the gas source group GSG. In the present embodiment, the processing gas is supplied by any one of the first to the third exemplary gas supply units GU. In the case of using the second gas supply unit GU, the gaseous mixture of a fluorocarbon gas and a rare gas is supplied from the gas source GS8. In the case of using the third exemplary gas supply unit GU, the first gas including a fluorocarbon gas and a rare gas is supplied from the gas source GS8 (first gas source) and the second gas including only a rare gas or including a fluorocarbon gas and a rare gas at a volume ratio different from that of the first gas is supplied from the gas source GS9 (second gas source). In the step ST4, a pressure in the processing chamber 12 is set to a predetermined level by the operation of the gas exhaust unit 50. Further, in the step ST4, the high frequency power from the first high frequency power supply 62 is supplied to the lower electrode LE. In the step ST4, the high frequency bias power from the second high frequency power supply 64 may or may not be supplied to the lower electrode LE.

In the step ST4, the high frequency power from the first high frequency power supply 62 is set such that the self-bias potential of the lower electrode LE on which the wafer W is mounted becomes greater than or equal to 4V and smaller than or equal to 350V. When the high frequency bias power from the second high frequency power supply 64 as well as the high frequency power from the first high frequency power supply 162 are supplied to the lower electrode LE, both of the high frequency power from the first high frequency power supply 62 and the high frequency bias power from the second high frequency power supply 64 are set such that the self-bias potential is generated. The self-bias potential tends to be increased as the high frequency power from the first high frequency power supply 62 is increased and as the high frequency bias power from the second high frequency power supply 64 is increased. Further, the self-bias potential depends on the pressure in the space in the processing chamber 12, the frequency of the high frequency power of the first high frequency power supply 62, and the frequency of the high frequency bias power from the second high frequency power supply 64. When the pressure in the space in the processing chamber 12, the frequency of the high frequency power of the first high frequency power supply 62, the frequency of the high frequency bias power from the second high frequency power supply 64 and the like are determined, the self-bias potential can be set to a desired value by controlling the high frequency power from the first high frequency power supply 62 and the high frequency bias power from the second high frequency power supply 64 in accordance with the above-described tendency.

Further, in the step ST4, the flow rate of the rare gas in the processing gas is set to be 250 to 5000 times of the flow rate of the fluorocarbon gas in the processing gas. In other words, a fluorocarbon gas diluted with a large amount of rare gas is used in the step ST4.

The step ST4 is executed under the following processing condition.

Pressure in processing chamber: 10 mTorr (1.33 Pa) to 100 mTorr (13.3 Pa)
Processing gas
$C_4F_6$ gas: 0.2 sccm to 4 sccm
Ar gas: 500 sccm to 1500 sccm
$O_2$ gas: 0.2 sccm to 5 sccm
High frequency power for plasma generation: 30 W to 500 W
High frequency bias power: 0 W to 100 W
Negative DC voltage of power supply 70: 0V to −600V In the step ST4, the first region R1 is etched by active species of fluorocarbon and/or fluorine obtained by generating a plasma of the processing gas, as shown in FIG. 9. Further, a deposit DP containing fluorocarbon and/or carbon is formed on the surface of the mask MK, the side surface defining the opening obtained by the etching, and the surface of the second region R2. The first region R1 is etched in a state where the second region R2 is protected by the deposit DP. When the step ST4 is completed, the first region R1 is etched to the bottom surface of the recess formed by the second region R2 as shown in FIG. 10.

In the step ST4 of the method MT, the fluorocarbon gas in the processing gas is diluted with a large amount of the rare gas and the self-bias potential is greater than or equal to 4V and lower than or equal to 350V, the erosion of the second region R2 is suppressed during the etching of the first region R1.

When the self-bias potential of the lower electrode LE is set to be 4V or above, the energy of the ions irradiated to the wafer W becomes 4 eV or above. When the ions having the energy of 4 eV or above are irradiated to the wafer W, the bond between silicon and oxygen forming the first region R1 is broken, thereby generating a reaction by-product of silicon and fluorine. The reaction by-product thus generated is discharged. When the self-bias potential of the lower electrode LE is set to 350V or less, the energy of ions irradiated to the wafer W becomes slightly greater than 350 eV. The ions having such energy do not penetrate through the deposit DP having a thickness of 2 nm. Therefore, when the self-bias potential is smaller than or equal to 350V, the erosion of the second region R2 is suppressed. When the fluorocarbon gas in the processing gas used in the step ST4 is diluted with the dilution gas of which flow rate is 250 to 5000 times greater than that of the fluorocarbon gas, the erosion of the second region R2 can be further suppressed while allowing the etching of the first region R1. This is considered because the amount of fluorine in the deposit DP is reduced and a relatively hard deposit DP is formed on the second region R2.

Figure 11:
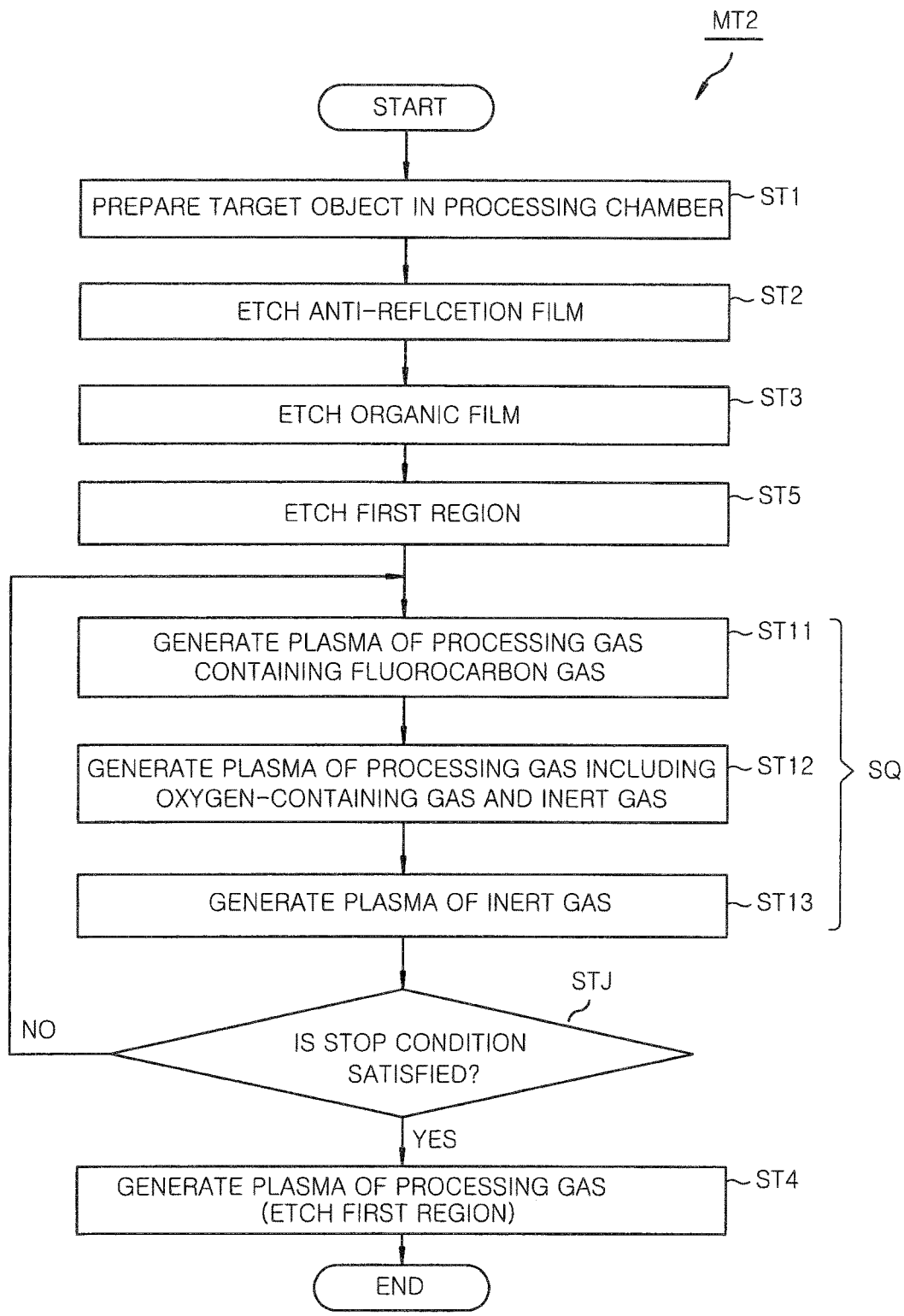
FIG. 11 is a flowchart showing an etching method according to another embodiment.

Hereinafter, an etching method according to another embodiment will be described. FIG. 11 is a flowchart showing an etching method according to another embodiment. A method MT2 shown in FIG. 11 is different from the method MT in that it includes a sequence SQ. The method MT2 may further include a step ST5. Hereinafter, FIGS. 12 to 15 will be referred to in addition to FIG. 11. FIGS. 12 to 15 are partially enlarged cross sectional views of the target object during implementation of the method shown in FIG. 11. In the following, an example in which the wafer W shown in FIG. 2 is processed by the method MT2 by using a single plasma processing apparatus 10 will be described. In each step of the method MT2 implemented by using the plasma processing apparatus 10, the operations of the respective units of the plasma processing apparatus 10 can be controlled by the control unit Cnt.

In the method MT2, the steps ST1 to ST3 are executed as in the case of the method MT and the wafer W having a state shown in FIG. 8 is obtained. Next, a step ST5 is executed. In the step ST5, the first region R1 is etched until immediately before the second region R2 is exposed. In other words, the first region R1 is etched until the first region R1 remains a little on the second region R2. To that end, in the step ST5, a processing gas is supplied into the processing chamber 12 from a gas source selected among the gas sources of the gas source group GSG. This processing gas includes a fluorocarbon gas. The processing gas may further include a rare gas, e.g., Ar gas. The processing gas may further include oxygen gas. In the step ST5, a pressure in the processing chamber 12 is set to a predetermined level by the operation of the gas exhaust unit 50. Moreover, in the step ST5, the high frequency power from the first high frequency power supply 62 and the high frequency bias power from the second high frequency power supply 64 are supplied to the lower electrode LE.

Figure 12:
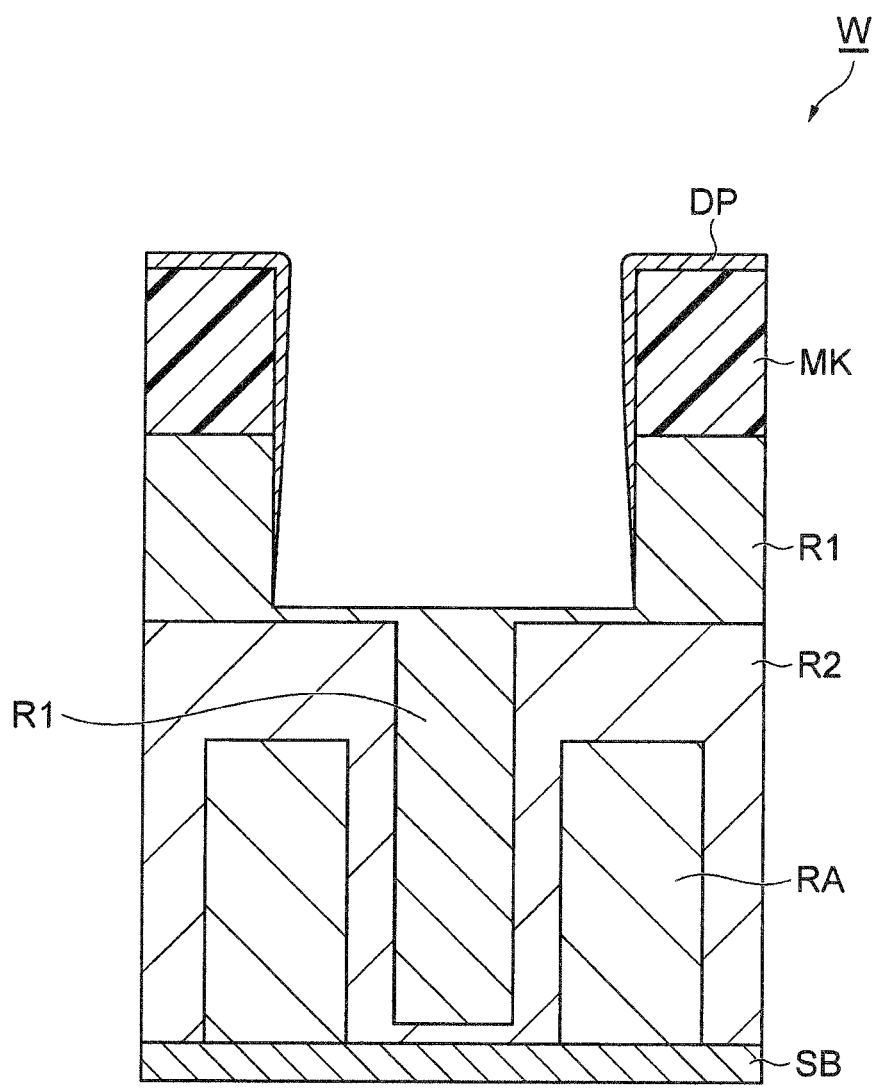
FIGS. 12 to 15 are partially enlarged cross sectional views of the target object during implementation of the method shown in FIG. 11.

As shown in FIG. 12, in the step ST5, the plasma of the processing gas is generated and a portion of the first region R1 which is exposed through the opening of the mask MK is etched by active species of fluorine and/or fluorocarbon. Further, in the step ST5, the deposit DP containing fluorocarbon and/or carbon is formed on the surface of the mask MK and the side surface defining the opening obtained by the etching. The processing time in the step ST5 is set such that a predetermined thickness of the first region R1 remains on the second region R2 when the step ST5 is completed.

The processing condition of the step ST5 may be identical to that of the step ST4. Or, the step ST5 may be executed under the following processing condition such that the etching of the first region R1 can be performed within a shorter period of time.

Pressure in processing chamber: 10 mTorr (1.33 Pa) to 50 mTorr (6.65 Pa)
Processing gas
$C_4F_8$ gas: 10 sccm to 30 sccm
$CF_4$ gas: 50 sccm to 150 sccm
Ar gas: 500 sccm to 1000 sccm
$O_2$ gas: 10 sccm to 30 sccm
High frequency power for plasma generation: 500 W to 2000 W
High frequency bias power: 500 W to 2000 W Next, in the method MT2, the sequence SQ is executed at least once. The sequence SQ is executed to etch the first region R1 in a period including a time when the second region R2 is exposed. The sequence SQ includes steps ST11 and ST13. In the present embodiment, the sequence SQ may further include a step ST12.

Figure 13:
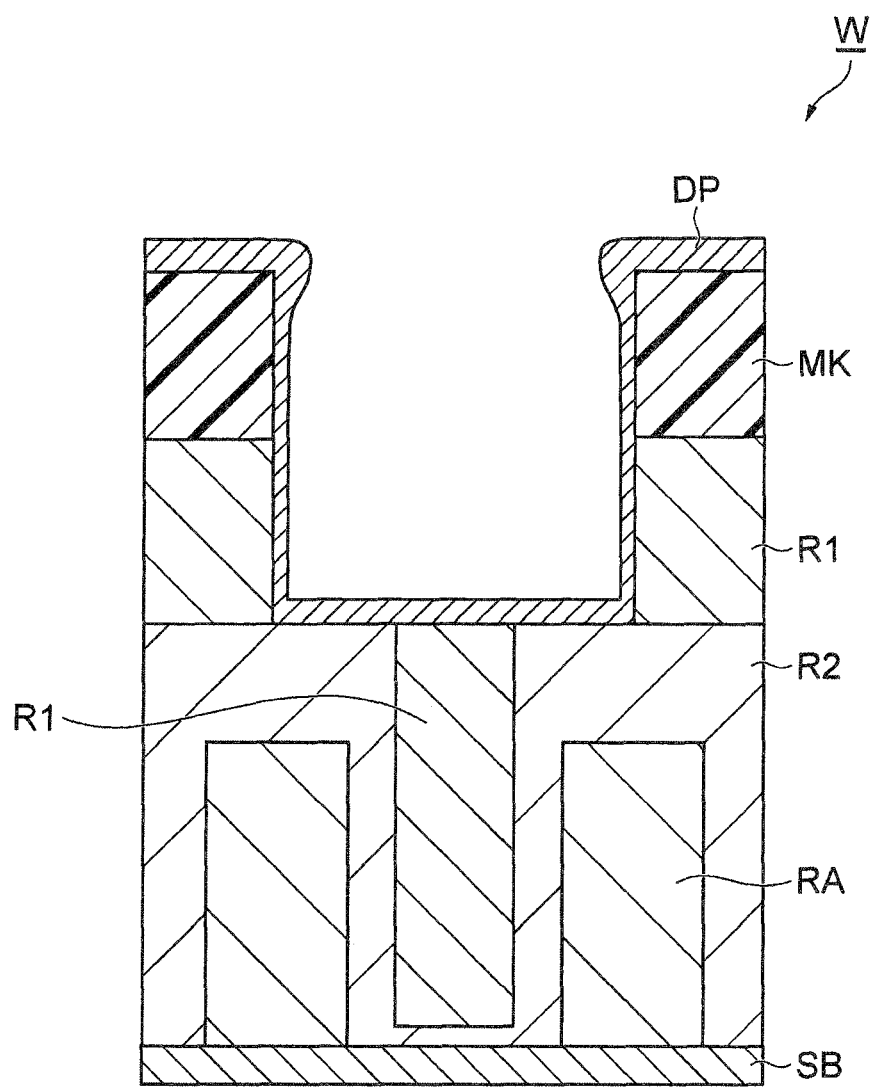

In the step ST11, the plasma of the processing gas is generated in the processing chamber 12 where the wafer W shown in FIG. 12 is accommodated. To that end, in the step ST11, a processing gas is supplied into the processing chamber 12 from a gas source selected among the gas sources of the gas source group GSG. The processing gas includes a fluorocarbon gas. The processing gas may further include a rare gas, e.g., Ar gas. In the step ST11, a pressure in the processing chamber 12 is set to a predetermined level by the operation of the gas exhaust unit 50. Further, in the step ST11, the high frequency power from the first high frequency power supply 62 is supplied to the lower electrode LE. The high frequency bias power from the second high frequency power supply 64 may be supplied to or may not be supplied to the lower electrode LE. In the step ST11, the plasma of the processing gas including a fluorocarbon gas is generated and dissociated fluorocarbon is deposited on the surface of the wafer W. As a result, the deposit DP is formed as shown in FIG. 13.

In the step ST11, the processing condition is different from those of the steps ST4 and ST5 and the processing condition that realizes a deposition mode, i.e., a mode in which deposition of deposit DP on the wafer W dominates over the etching of the first region R1, is selected. In this example, $C_4F_6$ gas is used as the fluorocarbon gas in the processing gas used in the step ST11.

The step ST11 is executed under the following processing condition.
  Pressure in processing chamber: 10 mTorr (1.33 Pa) to 50 mTorr (6.65 Pa)
  Processing gas
  $C_4F_6$ gas: 2 sccm to 10 sccm
  Ar gas: 500 sccm to 1500 sccm
  High frequency power for plasma generation: 100 W to 500 W
  High frequency bias power: 0 W Next, the step ST12 is executed in the present embodiment. In the step ST12, a plasma of a processing gas including an oxygen-containing gas and an inert gas is generated in the processing chamber 12. To that end, in the step ST12, the processing gas is supplied into the processing chamber 12 from a gas source selected from the gas sources of the gas source group GSG. In this example, this processing gas includes oxygen gas as the oxygen-containing gas. Further, in this example, the processing gas includes, as the inert gas, a rare gas such as Ar gas. The inert gas may be nitrogen gas. In the step ST12, a pressure in the processing chamber 12 is set to a predetermined level by the operation of the gas exhaust unit 50. In the step ST12, the high frequency power from the first high frequency power supply 62 is supplied to the lower electrode LE. In the step ST12, the high frequency bias power from the second high frequency power supply 64 may not be supplied to the lower electrode LE.

Figure 14:
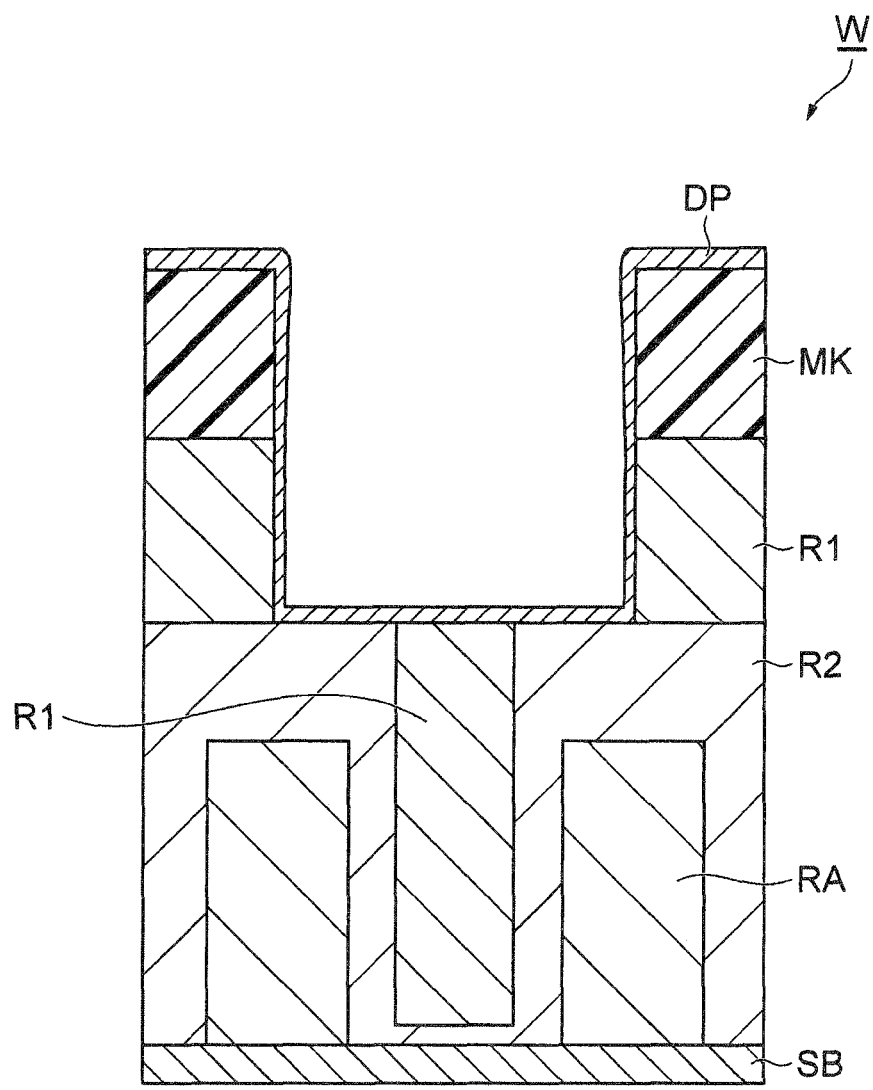

In the step ST12, active species of oxygen are generated and the amount of deposit DP on the wafer W is appropriately decreased by the active species of oxygen, as shown in FIG. 14. As a result, the opening in the mask MK and the opening formed by the etching are prevented from being blocked by an excessive amount of deposit DP. In the case of the processing gas used in the step ST12, the oxygen gas is diluted with the inert gas. Therefore, the excessive removal of the deposit DP is suppressed.

The step ST12 is executed under the following processing condition.
  Pressure in processing chamber: 10 mTorr (1.33 Pa) to 50 mTorr (6.65 Pa)
  Processing gas
  $O_2$ gas: 2 sccm to 20 sccm
  Ar gas: 500 sccm to 1500 sccm
  High frequency power for plasma generation: 100 W to 500 W
  High frequency bias power: 0 W In the present embodiment, the step ST12 in each sequence, i.e., a single step ST12, is executed for two or more seconds. In the step ST12, the deposit DP can be etched at a rate of 1 nm/sec or less. In the case of executing the sequence by using the plasma processing apparatus 10, it takes a time to switch gases for shifting the steps ST11 to ST13 from one to another. Therefore, the step ST12 needs to be executed for two or more seconds in consideration of time required for stabilization of discharge. However, if the etching rate of the deposit DP in the step ST12 is too high, the deposit for protecting the second region R2 may be excessively removed. Thus, the deposit DP is etched at a rate of 1 nm/sec or less in the step ST12. Accordingly, it is possible to appropriately control the amount of the deposit DP on the wafer W. The etching rate of the deposit DP which is 1 nm/sec or less in the step ST12 can be realized by selecting a pressure in the processing chamber, a degree of dilution of oxygen in the processing gas with a rare gas, i.e., an oxygen concentration, and a high frequency power for plasma generation from the above-described condition.

Next, in the step ST13, the first region R1 is etched. In the step ST13, a process of promoting reaction between fluorocarbon in the deposit DP and silicon oxide in the first region R1 is performed. To that end, in the step ST13, a processing gas is supplied into the processing chamber 12 from a gas source selected among the gas sources of the gas source group GSG. The processing gas includes an inert gas. In one example, the inert gas may be a rare gas such as Ar gas. Or, the inert gas may be nitrogen gas. In the step ST13, a pressure in the processing chamber 12 is set to a predetermined level by the operation of the gas exhaust unit 50. Further, in the step ST13, the high frequency power from the first high frequency power supply 62 and the high frequency bias power from the second high frequency power supply 64 are supplied to the lower electrode LE.

Figure 15:
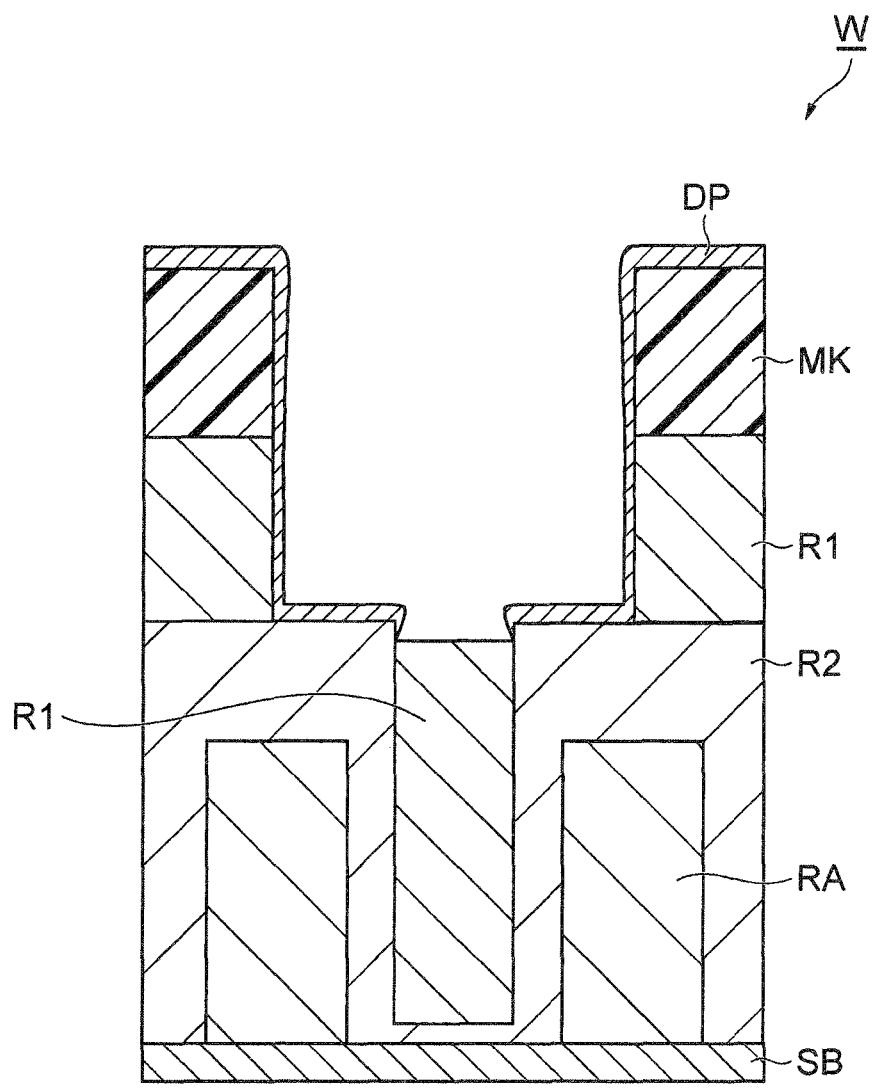

The step ST13 is executed under the following processing condition.
  Pressure in processing chamber: 10 mTorr (1.33 Pa) to 50 mTorr (6.65 Pa)
  Processing gas
  Ar gas: 500 sccm to 1500 sccm
  High frequency power for plasma generation: 100 W to 500 W
  High frequency bias power: 20 W to 300 W In the step ST13, the plasma of the inert gas is generated and ions are attracted to the wafer W. Accordingly, the reaction between radicals of fluorocarbon included in the deposit DP and silicon oxide of the first region R1 is promoted and, thus, the first region R1 is etched. By executing the step ST13, the first region R1 in the recess which is provided by the second region R2 is etched as shown in FIG. 15.

The sequence SQ may be executed once. In this case, the determination in a step STJ to be described later is not required, and the step ST4 is executed after the execution of the sequence SQ.

In the present embodiment, the sequence SQ is repeatedly executed. In other words, the sequence SQ is executed multiple times. In the present embodiment, it is determined in the step STJ whether or not a stop condition is satisfied. It is determined that the stop condition is satisfied when the sequence SQ has been performed a predetermined number of times. When it is determined in the step STJ that the stop condition is not satisfied, the sequence SQ is performed again from the step ST11. On the other hand, when it is determined in the step STJ that the stop condition is satisfied, a step ST4 is executed. The step ST4 of the method MT2 is the same step as the step ST4 of the method MT. when the execution of the step ST4 is terminated, the wafer W has a state in which the first region R1 is etched to the bottom surface of the recess formed by the second region R2 as shown in FIG. 10.

In the method MT2, the sequence SQ is performed when the second region R2 is exposed and the second region R2 is more reliably protected by the deposit DP. Then, the first region R1 is etched by radicals in the deposit DP. Therefore, the erosion of the second region R2 is further suppressed.

While various embodiments have been described, the disclosure may be variously modified without being limited to the above-described embodiments. For example, the target object to which the methods according to the above-described embodiments is not limited to the target object shown in FIG. 2. For example, the methods according to the above-described embodiments can be applied to any target object having the first region of silicon oxide and the second region of silicon nitride.

Further, the methods according to the above-described embodiments can be performed by using any plasma processing apparatus other than the capacitively coupled plasma processing apparatus. For example, the methods according to the above-described embodiments may be performed by using an inductively coupled plasma processing apparatus or a plasma processing apparatus for generating a plasma by a surface wave such as a microwave.

In the method MT2, the sequence SQ may be executed after the step ST3 without executing the step ST5. Further, the sequence SQ may not include the step ST12. On the other hand, when the sequence SQ includes the step ST12, the execution order of the step ST12 in the sequence SQ may be changed. for example, in the sequence SQ, the step ST12 may be executed after the step ST13.

Figure 16A:
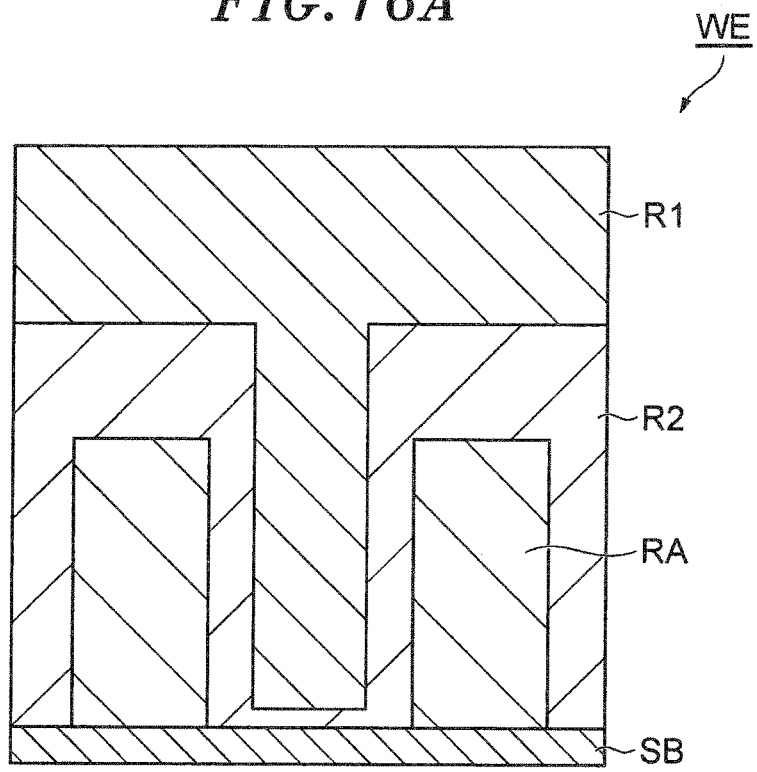
FIGS. 16A and 16B are views for explaining test examples 1 to 3 and comparative examples 1 and 2.
Figure 16B:
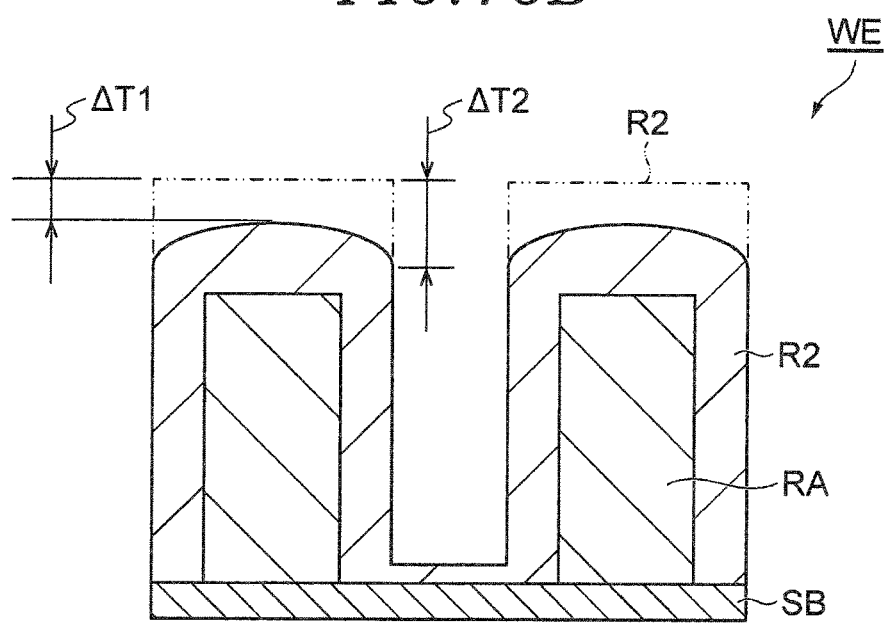

Hereinafter, test examples 1 to 3 executed to examine the step ST4 will be described. In the test examples 1 to 3, there was prepared a wafer WE having a state shown in a partially enlarged cross sectional view of FIG. 16A. The wafer WE includes a protruding region RA formed on the substrate SB, a second region R2 made of silicon nitride and covering the protruding region RA, and a first region R1 made of silicon oxide and covering the second region R2 while filling the recess formed by the second region R2. The recess formed by the second region R2 is a trench having a width of 20 nm and a depth of 150 nm. In comparative examples 1 and 2, the same wafer WE was prepared.

In each of the test examples 1 to 3 and the comparative examples 1 and 2, the first region R1 was etched under the following processing condition by using the plasma processing apparatus 10.

<Processing Condition of Test Example 1>
Pressure in processing chamber: 30 mTorr (4 Pa)
Flow rate of $C_4F_6$ gas: 4 sccm
Flow rate of Ar gas: 1000 sccm
Flow rate of $O_2$ gas: 5 sccm
Flow rate of Ar gas with respect to flow rate of $C_4F_6$ gas: 250 times
High frequency power of first high frequency power supply 62: 40 MHz, 500 W
High frequency bias power of second high frequency power supply 64: 13 MHz, 50 W
Self-bias potential of lower electrode LE: 350V
Negative DC voltage of power supply 70: −300V
Processing time: 10 minutes <Processing Condition of Test Example 2>
Pressure in processing chamber: 30 mTorr (4 Pa)
Flow rate of $C_4F_6$ gas: 0.8 sccm
Flow rate of Ar gas: 1000 sccm
Flow rate of $O_2$ gas: 0.8 sccm
Flow rate of Ar gas with respect to flow rate of $C_4F_6$ gas: 1250 times
High frequency power of first high frequency power supply 62: 40 MHz, 300 W
High frequency bias power of second high frequency power supply 64: 13 MHz, 0 W
Self-bias potential of lower electrode LE: 150V
Negative DC voltage of power supply 70: −300V
Processing time: 10 minutes <Processing Condition of Test Example 3>
Pressure in processing chamber: 30 mTorr (4 Pa)
Flow rate of $C_4F_6$ gas: 0.2 sccm
Flow rate of Ar gas: 1000 sccm
Flow rate of $O_2$ gas: 0.2 sccm
Flow rate of Ar gas with respect to flow rate of $C_4F_6$ gas: 5000 times
High frequency power of first high frequency power supply 62: 40 MHz, 120 W
High frequency bias power of second high frequency power supply 64: 13 MHz, 0 W
Self-bias potential of lower electrode LE: 50V
Negative DC voltage of power supply 70: −300V
Processing time: 10 minutes <Processing Condition of Comparative Example 1>
Pressure in processing chamber: 30 mTorr (4 Pa)
Flow rate of $C_4F_6$ gas: 8 sccm
Flow rate of Ar gas: 1000 sccm
Flow rate of $O_2$ gas: 10 sccm
Flow rate of Ar gas with respect to flow rate of $C_4F_6$ gas: 125 times
High frequency power of first high frequency power supply 62: 40 MHz, 500 W
High frequency bias power of second high frequency power supply 64: 13 MHz, 100 W
Self-bias potential of lower electrode LE: 50V
Negative DC voltage of power supply 70: −300V
Processing time: 10 minutes <Processing Condition of Comparative Example 2>
Pressure in processing chamber: 30 mTorr (4 Pa)
Flow rate of $C_4F_6$ gas: 7.6 sccm
Flow rate of Ar gas: 1000 sccm
Flow rate of $O_2$ gas: 10 sccm
Flow rate of Ar gas with respect to flow rate of $C_4F_6$ gas: 131 times
High frequency power of first high frequency power supply 62: 40 MHz, 300 W
High frequency bias power of second high frequency power supply 64: 13 MHz, 0 W
Self-bias potential of lower electrode LE: 150V
Negative DC voltage of power supply 70: −300V
Processing time: 10 minutes In the test examples 1 to 3 and the comparative examples 1 and 2, SEM images of the processed wafer WE were obtained and there were measured a reduced amount $\Delta T1$ of a film thickness of the second region R2 disposed above the central portion of the protruding region RA (difference of the film thickness of the second region R12 before and after the processing) and a reduced amount $\Delta T1$ of a film thickness of the second region R2 disposed at the shoulder portion of the second region R2 (difference of the film thickness of the second region R2 before and after processing). As a result, $\Delta T1$ in the test example 1 was 2.4 nm; $\Delta T2$ in the test example 1 was 6.3 nm; $\Delta T1$ and $\Delta T2$ in the test example 2 were 0 nm; $\Delta T1$ and $\Delta T2$ in the test example 3 were 0 nm. Further, $\Delta T1$ in the comparative example 1 was 14.7 nm;

ΔT2 in the comparative example 1 was 23.9 nm; ΔT1 in the comparative example 2 was 11.1 nm; and ΔT2 in the comparative example 2 was 17.6 nm. In the comparative example 1, i.e., in the example in which the etching was performed under the processing condition that the flow rate of Ar gas was 125 times of the flow rate of $C_4F_6$ gas and the self-bias potential was 500V, the second region R2 was considerably eroded and the film thickness of the second region R2 was considerably decreased. In the comparative example 2 using the self-bias potential lower than that of the comparative example 1, the film thickness of the second region R2 was decreased by 10 nm or more. This is because, in the comparative example 2, the flow rate of Ar gas with respect to the flow rate of $C_4F_6$ gas was 131 times which is less than 250 times. On the other hand, in the test examples 1 to 3, the reduced amount of the film thickness of the second region R2 was considerably small. Therefore, it is clear that in the methods MT and MT2, the first region R1 can be etched while suppressing the erosion of the second region R2 by executing the step ST4.

While the disclosure has been shown and described with respect to the embodiments, it will be understood by those skilled in the art that various changes and modifications may be made without departing from the scope of the disclosure as defined in the following claims.

What is claimed is:

1. A method for selectively etching a first region of silicon oxide with respect to a second region of silicon nitride, the method comprising:
   preparing a target object including the first region, the second region, and an organic film in a processing chamber of a plasma processing apparatus, wherein the first region covers the second region, and the organic film covers the first region and includes amorphous carbon;
   etching the organic film by generating a first plasma of a first processing gas including hydrogen gas and nitrogen gas; and
   etching the first region by generating a second plasma of a second processing gas containing a fluorocarbon gas and a rare gas in the processing chamber,
   wherein in said generating the plasma of the second processing gas, a self-bias potential of a lower electrode on which the target object is mounted is greater than or equal to 4V and smaller than or equal to 350V and a volumetric flow rate of the rare gas in the second processing gas is 250 to 5000 times of a volumetric flow rate of the fluorocarbon gas in the second processing gas,
   wherein the second region forms a recess and the first region fills the recess and covers the second region,
   the method further comprising:
   after the step of etching the first region by generating the second plasma, executing a sequence one or more times to further etch the first region in a period including a time when the second region is exposed,
   wherein the sequence includes:
   generating a third plasma of a third processing gas including a fluorocarbon gas in the processing chamber and forming a deposit containing fluorocarbon on the first region and the second region; and
   generating a fourth plasma of an inert gas in the processing chamber.

2. The method of claim 1, wherein in said generating the plasma of the second processing gas, in order to supply the second processing gas into the processing chamber, a first gas including a fluorocarbon gas and a rare gas is supplied from a first gas source into the processing chamber and a second gas including only a rare gas or including a fluorocarbon gas and a rare gas at a volume ratio different from a volume ratio of the first gas is supplied from a second gas source into the processing chamber.

3. The method of claim 1, wherein the rare gas is argon gas.

4. The method of claim 1, wherein the second processing gas further includes oxygen gas.

5. The method of claim 1, wherein the second processing gas includes a first fluorocarbon gas for etching the first region until immediately before the second region is exposed, and the third processing gas includes a second fluorocarbon gas for generating the third plasma and forming the deposit containing fluorocarbon on the first region and the second region, and wherein the first fluorocarbon gas includes $C_4F_8$ gas, and the second fluorocarbon gas includes $C_4F_6$ gas.

6. The method of claim 5, wherein the method further includes: generating a fifth plasma of a fourth processing gas including an oxygen-containing gas and an inert gas.

7. The method of claim 6, wherein the deposit is etched at a rate of 1 nm/sec or less.

8. A method for selectively etching a first region of silicon oxide with respect to a second region of silicon nitride, the method comprising:
   preparing a target object including the first region, the second region, and an organic film in a processing chamber of a plasma processing apparatus, wherein the first region covers the second region, and the organic film covers the first region and includes amorphous carbon;
   etching the organic film by generating a first plasma of a first processing gas including hydrogen gas and nitrogen gas; and
   etching the first region by generating a second plasma of a second processing gas containing a fluorocarbon gas and a rare gas in the processing chamber,
   wherein in said generating the plasma of the second processing gas, a self-bias potential of a lower electrode on which the target object is mounted is greater than or equal to 4V and smaller than or equal to 350V and a volumetric flow rate of the rare gas in the second processing gas is 250 to 5000 times of a volumetric flow rate of the fluorocarbon gas in the second processing gas,
   wherein in said generating the plasma of the second processing gas, in order to supply the second processing gas into the processing chamber, a gaseous mixture of a fluorocarbon gas and a rare gas is supplied from a single gas source into the processing chamber.

9. A method for selectively etching a first region of silicon oxide with respect to a second region of silicon nitride, the method comprising:
   preparing a target object including the first region and the second region in a processing chamber of a plasma processing apparatus, the first region covering the second region;
   etching the first region until immediately before the second region is exposed by generating a first plasma of a first processing gas including a first fluorocarbon gas;
   after the step of etching the first region, executing a sequence one or more times to further etch the first region in a period including a time when the second region is exposed,
   wherein the sequence includes:

generating a second plasma of a second processing gas including a second fluorocarbon gas in the processing chamber and forming a deposit containing fluorocarbon on the first region and the second region;

generating a third plasma of a third processing gas including an inert gas in the processing chamber; and generating a fourth plasma of a fourth processing gas including the second fluorocarbon gas and a rare gas to further etch the first region, wherein in said generating the fourth plasma of the fourth processing gas including the third fluorocarbon gas and the rare gas, a self-bias potential of a lower electrode on which the target object is mounted is greater than or equal to 4V and smaller than or equal to 350V and a volumetric flow rate of the rare gas in the processing gas is 250 to 5000 times of a volumetric flow rate of the third fluorocarbon gas in the processing gas, and wherein the first fluorocarbon gas includes $C_4F_8$ gas, and the second fluorocarbon gas includes $C_4F_6$ gas.

10. The method of claim 9, wherein the method further includes:

generating a fifth plasma of a fifth processing gas including an oxygen-containing gas and an inert gas.

11. The method of claim 10, wherein the deposit is etched at a rate of 1 nm/sec or less.

* * * * *